(12) United States Patent
Sato

(10) Patent No.: US 7,935,630 B2
(45) Date of Patent: May 3, 2011

(54) WIRING STRUCTURE AND WIRING DESIGNING METHOD

(75) Inventor: Motonobu Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 513 days.

(21) Appl. No.: 11/972,944

(22) Filed: Jan. 11, 2008

(65) Prior Publication Data

US 2008/0179084 A1   Jul. 31, 2008

(30) Foreign Application Priority Data

Jan. 12, 2007   (JP) .................................. 2007-004554

(51) Int. Cl.
*H01L 21/44* (2006.01)

(52) U.S. Cl. ........ 438/666; 438/669; 438/468; 438/957; 438/761; 257/774; 257/208; 257/773

(58) Field of Classification Search ................ 257/208, 257/758, 773; 438/666, 669, 468, 957, 761
See application file for complete search history.

(56) References Cited

U.S. PATENT DOCUMENTS

| 6,989,597 | B2 | 1/2006 | Fujino et al. |
| 2006/0163737 | A1* | 7/2006 | Goller et al. ................. 257/758 |

FOREIGN PATENT DOCUMENTS

| CN | 1856877 A | 11/2006 |
| JP | 3-42856 A | 2/1991 |
| JP | 2004-158846 A | 6/2004 |

OTHER PUBLICATIONS

Chinese Office Action dated Dec. 6, 2010, issued in corresponding Chinese Patent Application No. 200910179459.1.

\* cited by examiner

*Primary Examiner* — William M Brewster
*Assistant Examiner* — Wilner Jean Baptiste
(74) *Attorney, Agent, or Firm* — Westerman, Hattori, Daniels & Adrian, LLP

(57) ABSTRACT

A designing method of a semiconductor device having a first wire and a second wire with a plurality of vias includes determining a first life time change rate of the semiconductor device in response to a change in a number of via column, a second life time change rate of the semiconductor device in response to a change in a number of via row, reducing the number of via column according to a ratio based on the first life time change and the second life time change; and increasing the number of via row at least one.

14 Claims, 7 Drawing Sheets

FIG. 3

| N=1.4/0.14 = 10 | | "1" represents minimum line width that permit one via to be arranged | | | | |
|---|---|---|---|---|---|---|
| | W [a.u.] | 3 | 10 | 20 | 30 | 40 |
| example | Via row (W) | 2 | 5 | 10 | 15 | 20 |
| | Via Col.(L) | 2 | 2 | 2 | 2 | 2 |
| | Life(1) | 1 | 1 | 1 | 1 | 1 |
| First embodiment | Via row (W) | 1 | 1 | 1 | 5 | 10 |
| | Via Col.(L) | 3 | 3 | 3 | 3 | 3 |
| | Change of Life | 3.53 | 2.32 | 1.15 | 1.00 | 1.00 |
| Second embodiment | Via row (W) | 1 | 1 | 1 | 1 | 1 |
| | Via Col.(L) | 3 | 3 | 3 | 4 | 4 |
| | Change of Life | 3.53 | 2.32 | 1.15 | 2.32 | 1.15 |

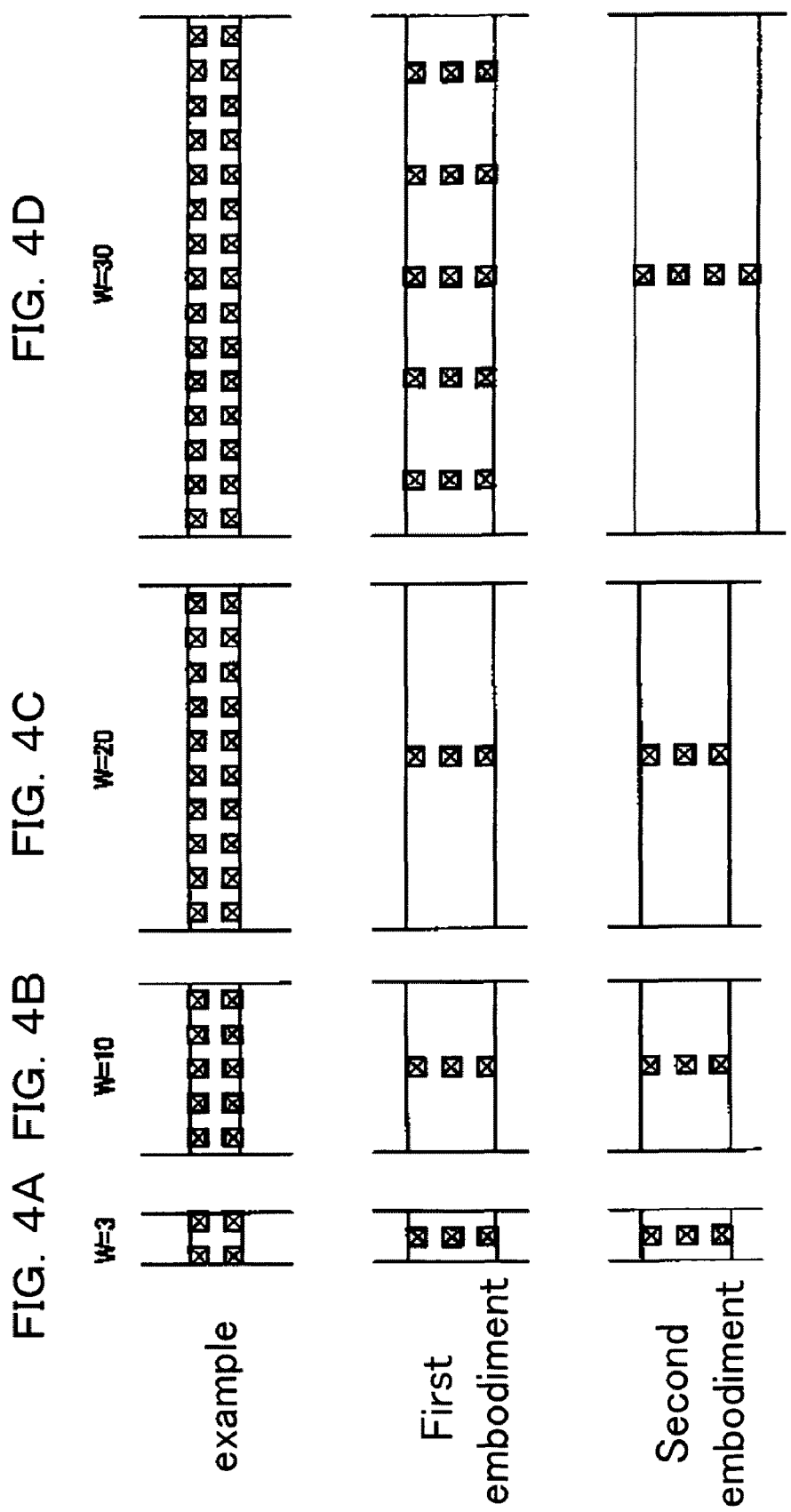

WIRING STRUCTURE AND WIRING DESIGNING METHOD

TECHNICAL FIELD

The present invention generally relates to design of semiconductor devices. More particularly, the present invention relates to design of wiring in semiconductor devices having a multilayer wiring structure including via connections.

BACKGROUND

When high-density current flows through a fine wire included in a semiconductor device having a multilayer wiring structure, movement of electrons disturbs arrangement of atoms (such as cupper atoms or aluminum atoms) constituting the wire, which causes diffusion or migration of the metal atoms. This phenomenon is called electromigration (EM). EM forms voids in the wire, leading to a further increase in the current density and in the temperature. As a result, void formation is accelerated, which may ultimately result in disconnection.

Accordingly, it has been considered that a number of vias has to be increased in proportion to an increase in an amount of current flowing through a wire. More specifically, to suppress EM, interconnections of wide or thick wires that carry a great amount of current are designed to be provided with many vias so as to lower the amount of current per via.

For example, as shown in FIGS. 1A and 1B, a single connection via is used for connecting narrow wires M1L and M3L that are parallel to or orthogonal to one another. On the other hand, the number of vias is increased both in a wire-width direction (W) and a wire-length direction (L) to connect wide or thick parallel wires shown in FIG. 1C. When the wide or thick wires M1L and M3L are orthogonal to one another, the number of vias may be further increased as shown in FIG. 1D.

The current density of current flowing through wires increases as miniaturization of semiconductor devices advances. Thus, an allowable number of vias also tends to increase regarding the same amount of current and the same wire width. The increase in the number of vias is prone to increase diameter of a provided via, which, in turn, reduces a margin between adjacent wires, and thus undesirably causing layers to easily come off.

For the purpose of preventing an interlayer insulating film from coming off or preventing a large-scale integrated circuit (LSI) from being destroyed, a method for reducing the number of electric contacts per area by widening intervals of provided contacts than those decided in a manufacturing process has been suggested (see, for example, Japanese Laid-open Patent Publication No. 2004-158846). This method allows reduction in the number of contacts both in the wire-width direction and in the wire-length direction.

However, since recently available semiconductor devices have a greater allowable current value, a method for simply reducing the number of contacts per area, such as the method disclosed in Japanese Laid-open Patent Publication No. 2004-158846, may not guarantee EM resistance. In addition, the method disclosed in Japanese Laid-open Patent Publication No. 2004-158846 does not consider the direction of current.

In view of a fact that EM is likely to occur at vias arranged in lines at the end where current gathers, e.g., five vias arranged at the left and right ends shown in FIGS. 1C and 1D, in interlayer connections with a via matrix, a configuration of arranging vias along a wire in a line has been suggested (see, for example, Japanese Laid-open Patent Publication No. 3-42856). In this method, although vias are arranged in a line to be parallel to the wire, the number of the vias used for connecting wires on upper and lower layers is not reduced in order to ensure the number of vias corresponding to an amount of flowing current. As a result, since a via-occupying area does not change, disadvantages, such as reduction in a margin between adjacent wires, peeling of an insulating film, and reduction in throughput of the electron beam lithography, still remain.

SUMMARY

According to a one aspect of the present invention, a designing method of a semiconductor device having a first wire and a second wire with a plurality of vias includes determining a first life time change rate of the semiconductor device in response to a change in a number of via column, a second life time change rate of the semiconductor device in response to a change in a number of via row, reducing the number of via column according to a ratio based on the first life time change and the second life time change; and increasing the number of via row at least one.

BRIEF DESCRIPTION OF THE DRAWINGS

FIG. 3 is a table comparatively showing via matrices according to embodiments of the present invention and via matrices according to a method in the related art.

FIGS. 4A to 4D are schematic diagrams of wiring design employing via matrices shown in FIG. 3.

DESCRIPTION OF THE PREFERRED EMBODIMENTS

Preferred embodiments of the present invention will be described below with reference to the attached drawings.

Figure 1A:
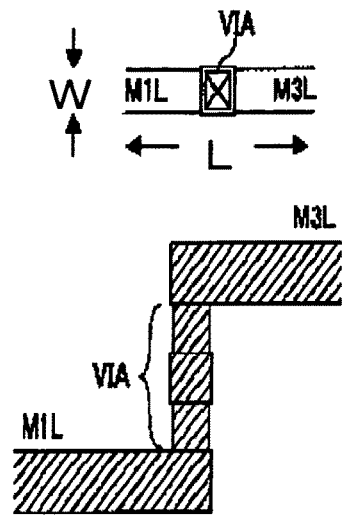
FIGS. 1A to 1D are diagrams of general via matrices in multilayer wiring and cross-sections thereof.
Figure 1B:
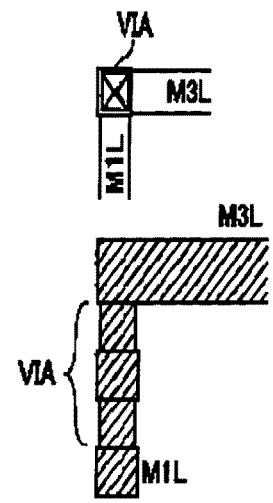
Figure 1C:
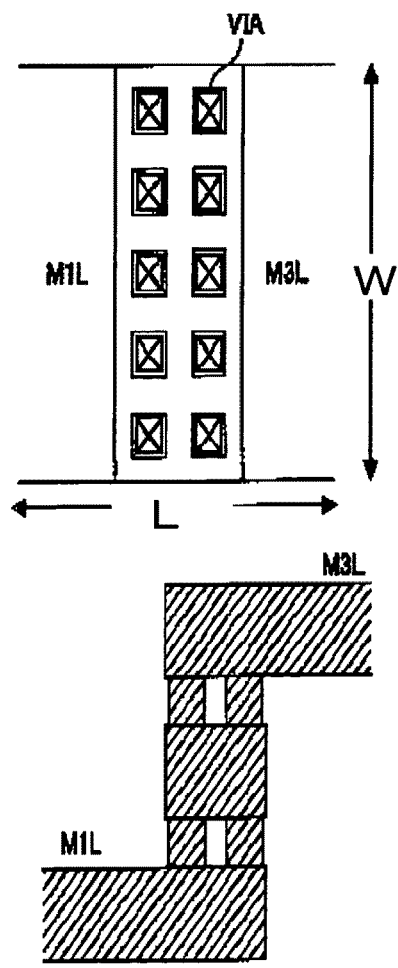
Figure 1D:
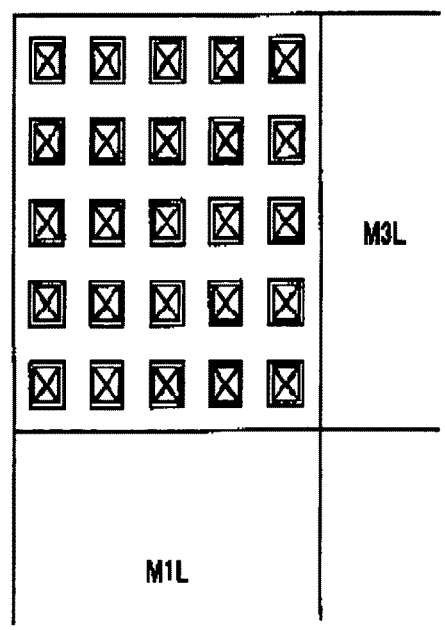
Figure 2A:
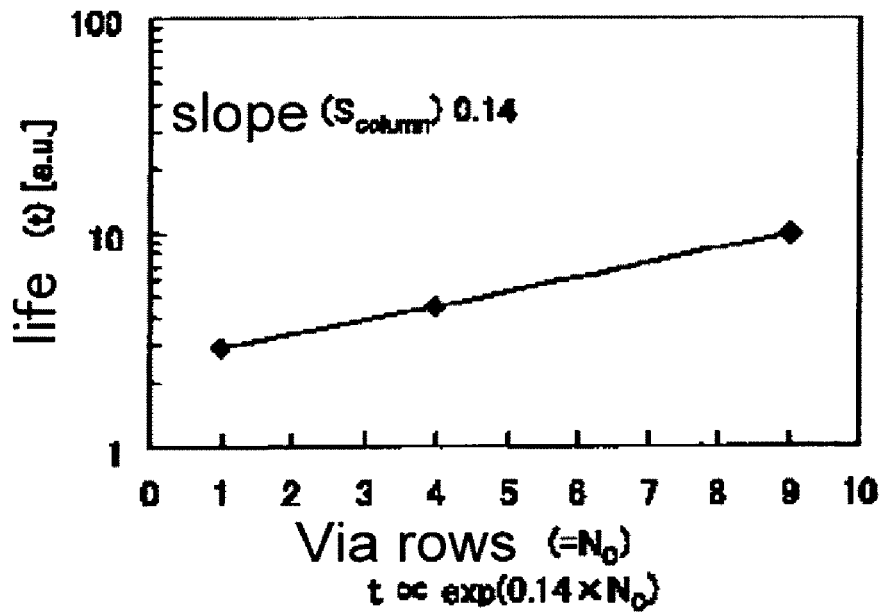
FIGS. 2A and 2B are diagrams for describing a principle of the present invention.
Figure 2B:
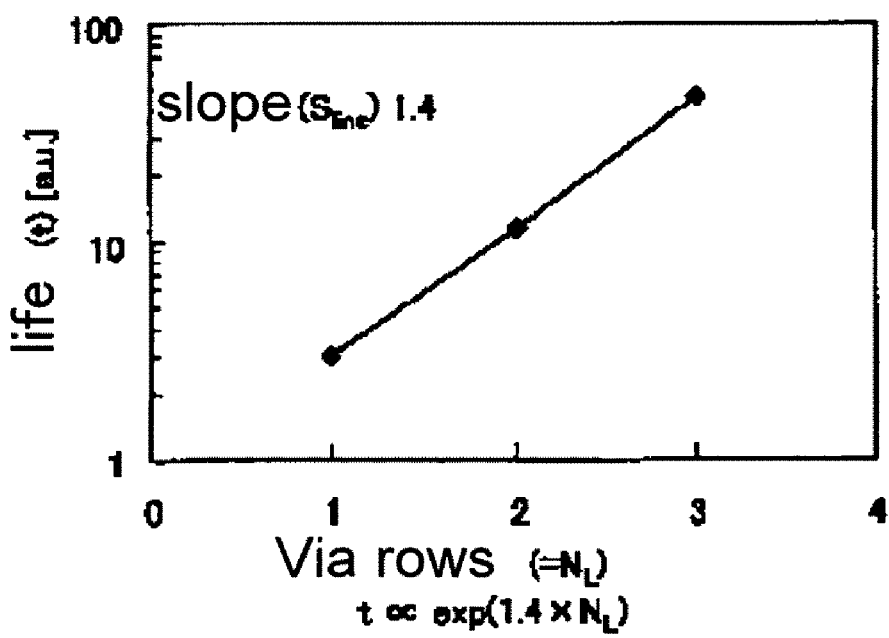

FIGS. 2A and 2B are graphs for describing a principle of wiring designing methods according to embodiments of the present invention. More specifically, FIG. 2A shows a change in a wire life in response to a change in the number of via columns constituting a via matrix in multilayer wiring, whereas FIG. 2B shows a change in a wire life in response to a change in the number of via rows in the multilayer wiring. Here, the number of via columns and the number of via rows correspond to the number of vias arranged in a wire-width direction and the number of vias arranged in a wire-length direction, respectively.

Referring to FIG. 2A, a wire life "t" is proportional to "exp (slope×number of via columns)", and a relationship of "$t \propto \exp(S_{column} \times N_C)$" is satisfied. Here, $N_C$ represents the number of via columns, whereas $S_{column}$ represents a rate of change or a slope. In this graph, $S_{column}$ is equal to 0.14.

Referring to FIG. 2B, a wire life "t" is proportional to "exp (slope×number of via rows)", and a relationship of "t∝exp $(S_{line} \times N_L)$" is satisfied. Here, $N_L$ represents the number of via rows, whereas $S_{line}$ represents a rate of change or a slope. In this graph, $S_{line}$ is equal to 1.4.

The graphs shown in FIGS. 2A and 2B indicate that the life, namely, EM resistance, does not decreases much in response to significant reduction in the number of via columns but the life significantly increases by increasing the number of via rows by one. More specifically, when "N" represents a ratio of a variation in the number of via columns to a variation in the number of via rows (hereinafter, simply referred to as the ratio N), suppose that N=(slope for the change in the life in response to the change in the number of via rows)/(slope for the change in the life in response to the change in the number of via columns)=

$$(S_{line})/(S_{column}) \quad (1)$$

where, N is an integer obtained by discarding the fractional part. In this case, even if the number of via columns ($N_C$) is reduced by $N=(S_{line})/(S_{column})=10$, equivalent EM resistance can be obtained by increasing the number of via rows ($N_L$) by 1.

By significantly reducing the number of via r columns and slightly increasing the number of via rows utilizing this principle, it is possible to maintain or improve EM resistance while reducing the total number of vias. Although the total number of vias may increase due to this operation depending on a value of the calculated "N" or the number of via rows, the total number of vias decreases by performing this operation a plurality of times. Specific embodiments will be described below using this principle.

FIG. 3 is a table that comparatively showing, at various widths, via matrices obtained using known wiring designing methods and via matrices obtained using wiring designing methods according to first and second embodiments of the present invention. In the table, the ratio "N" is set equal to 10 (N=1.4/0.14=10) in accordance with the example shown in FIGS. 2A and 2B. Regarding the widths, the table shows cases where the width is equal to 3, 10, 20, 30, and 40, when a minimum width that permits one via to be arranged is equal to 1 (a unit of width). Additionally, the table shows an improvement factor of the life at each width in the embodiments, when the life of wire in the known method is equal to 1.

In the first embodiment, according to the principle shown in FIGS. 2A and 2B, the number of via columns in the via matrix connecting wires on different layers is reduced on the basis of the ratio "N". At the same time, the number of via rows is increased by at least one.

In an example reduction method, in a case where the number of via columns to be processed is 15, a value obtained by subtracting the ratio "N" from the number of via columns is set as the number of via columns. If the number of via columns to be processed is not greater than the ratio "N", the number of via columns is set to one.

In the second embodiment, the number of via columns is ultimately set to one regardless of the width by repeating the method according to the first embodiment. At this time, the number of via rows is increased by one every time the method is repeated. That is, every time the number of via rows is increased by one, the number of via columns is decreased by "N", which is repeated until the number of via columns is set to one.

FIGS. 4A to 4D are schematic diagrams of wiring designs based on via matrices shown in FIG. 3. Referring to FIG. 4A, in the case where the width is equal to 3 (W=3), a known method employs a via matrix of 2 rows by 2 columns. With the method according to the first embodiment, since the number of via columns to be processed is equal to 2 and is smaller than the ratio "N"=10, the number of via columns is reduced to one and the number of via rows is increased by one and set to three. As a result, a via matrix of 3 rows by 1 column is obtained.

Despite of the reduction of the total number of vias by one, this via matrix improves the wire life approximately 3.5 times.

The same applies to the case where the width is equal to 10 shown in FIG. 4B and to the case where the width is equal to 20 shown in FIG. 4C. Referring to FIG. 4B, wires are connected with 10 vias in a matrix of 2 rows by 5 columns in the known method. By arranging 3 vias in a line in the wire-length direction based on the method according to the first embodiment, 2.32-times improved life is obtained. Referring to FIG. 4C, by arranging a via matrix of 3 rows by 1 column instead of arranging 20 vias in a matrix of 2 rows by 10 columns, 1.15-times improved life can be achieved. That is, despite of significant reduction in the number of vias, EM resistance not inferior to that provided with the known method is obtained.

Referring to FIG. 4D, a via matrix of 2 rows by 15 columns is employed in the known method. On the contrary, according to the first embodiment, the number of via columns is reduced by N=10 and set to five columns, whereas the number of via rows is increased by one and set to three. As a result, a via matrix of 3 rows by 5 columns is obtained. Although not shown in the schematic diagrams of FIGS. 4A to 4D, the same applies to a case where the width is equal to 40, as shown in the table of FIG. 3. The via matrix of 2 rows by 20 columns employed in the known method can be reduced to that of 3 rows by 10 columns. In each case, the method according to the first embodiment can reduces the total number of vias to a half and three quarters of the original and can maintain the life at least equivalent to that obtained with the known method, when it is compared with the known method.

As described above, in the first embodiment, the number of via columns to be processed is reduced on the basis of the ratio $N=S_{line}/S_{column}$, which is determined from rates of change in the life in the wire-width direction and the life in the wire-length direction. At the same time, the number of via rows is increased by one. Accordingly, the first embodiment can significantly reduce the number of vias that connect wires on upper and lower layers while maintaining the equivalent EM resistance level. In addition, since the first embodiment can prevent vias in a via matrix from being arranged closely, the first embodiment can overcome disadvantages, such as peeling of interlayer insulating films, reduction in throughput of the electron beam lithography, and reduction in design margins due to an increase in the diameter of a via.

In the cases where the width is equal to 30 (corresponding to FIG. 4D) and 40 shown in FIG. 3, i.e., in the cases where the original number of via columns to be processed is greater than the ratio "N", the method according to the first embodiment can be repeated as the second embodiment. By repeating the operation according to the first embodiment a plurality of times, the number of via columns can be reduced ultimately to one.

For example, referring back to FIG. 4D, a first operation for increasing and decreasing the numbers of via columns and via rows provides a via matrix of 3 rows by 5 columns. By performing a second operation for increasing and decreasing the numbers of via columns and via rows in this state, the number of via columns is reduced to one and the number of via rows is increased by one, thereby obtaining a via matrix of 4 rows by 1 column. As described above, a slight decrease in EM resistance due to the reduction in the number of via columns is compensated more than enough by an increase in the number of via rows by one. Thus, the via matrix of 4 rows by 1 column can achieve EM resistance twice or more as high as that provided by the via matrix of 2 rows by 15 columns with the known method. Similarly, when the original number of vias is equal to 20 in FIG. 3, a via matrix of 4 rows by 1 column is ultimately obtained by performing the second operation for increasing and decreasing the numbers of via columns and via rows.

There may be a case where the total number of vias is decreased but the wire life is as good as that before the operation for increasing and decreasing the numbers of via columns and via rows is performed as a result of performing the operation according to the first embodiment one or more times, i.e., a case where a rate of change in life is approximately 1.0. In such a case, to further improve the life, an operation for simply increasing the number of via rows or via columns by one via row or one via column may be added as long as the total number of vias in the via matrix after the operation for increasing and decreasing the numbers of via columns and via rows does not exceed the total number of vias before the operations. With this configuration, it is possible to improve EM resistance only with the wiring design while keeping the total number of vias equal to or lower than the number of the vias before the operations.

Figure 5A:
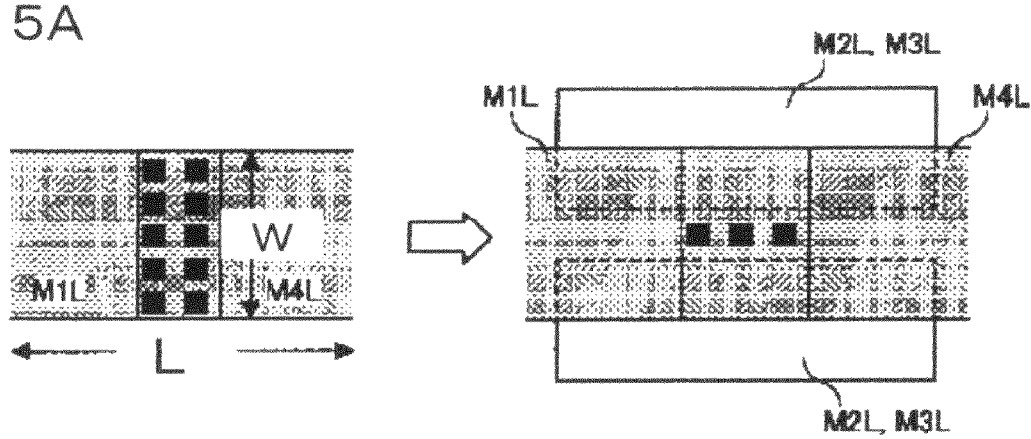
FIGS. 5A to 5C are diagrams for describing advantages of wiring configurations according to first and second embodiments of the present invention.
Figure 5B:
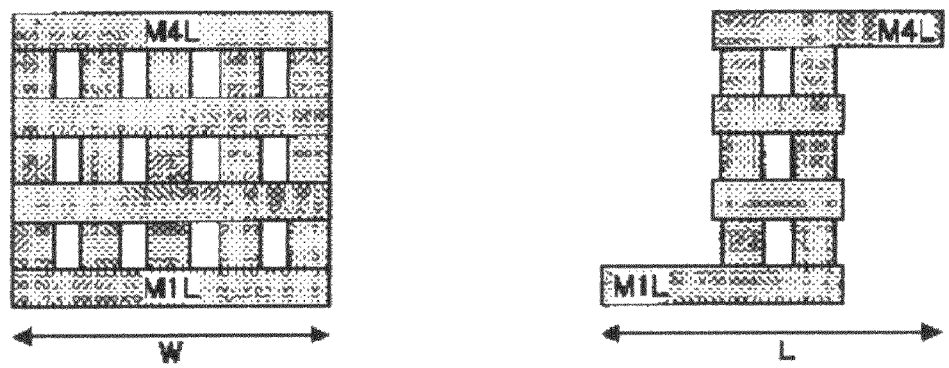
Figure 5C:
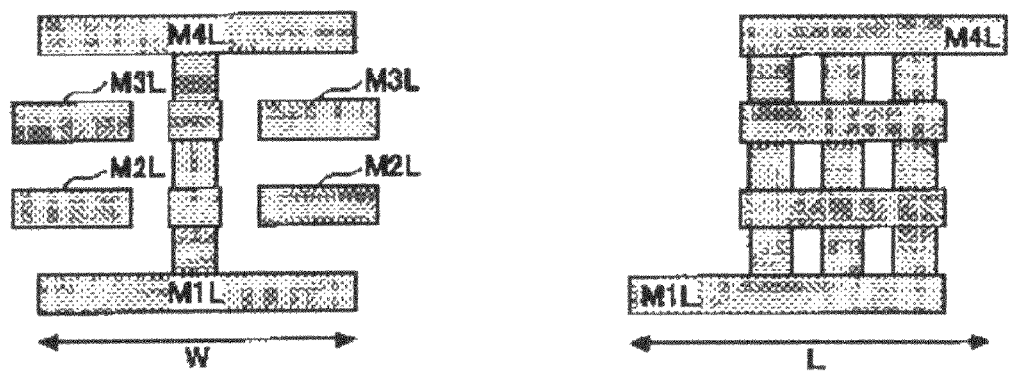

FIGS. 5A to 5C show advantages obtained by employing via matrices according to the first and second embodiments. In the first and second embodiments, when a via matrix is used for connecting wires on upper and lower layers in multilayer wiring, the number of via columns is significantly reduced in view of a difference between rates of change in the life in the wire-width direction and in the wire-length direction, whereas the number of via rows is slightly increased. This configuration is particularly advantageous when wires on upper and lower layers, which are apart from each other by two or more layers, are connected.

For example, in a case where a first layer M1L and a fourth layer M4L are connected with a known via matrix of 2 rows by 5 columns as shown in FIGS. 5A, 5B via matrices of the same size occupy a second layer M2L and a third layer M3L, which thus are not available.

On the other hand, the methods according to the first and second embodiments allow intermediate layers to be efficiently utilized by reducing the number of via columns by "N" columns or to one column as shown in FIG. 5C. More specifically, it is possible to form another wire on the both sides of the via columns, e.g., a wire connected to a passive component, on the second layer M2L and the third layer M3L.

FIGS. 6A to 6F and FIGS. 7A and 7F show a wiring designing method according to a third embodiment of the present invention. More specifically, FIGS. 6A to 6F show a design example employed when width and thickness of wires on upper and lower layers are the same. FIGS. 7A to 7F show a design example employed when width and thickness of wires on upper and lower layers are different.

In the third embodiment, vias are arranged in a line to be parallel to a wire located on an electron-flow downstream side viewed from the vias since electromigration is likely to occur in this direction. Depending on operations of a device, electrons may flow in both directions through the wire. In such a case, vias are arranged in parallel to both wires on upper and lower layers.

Figure 6A:
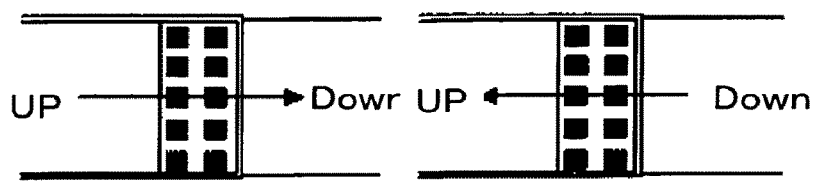
FIGS. 6A to 6F are diagrams for showing via matrices according to a third embodiment of the present invention in which wires of the same width and the same thickness located on upper and lower layers are connected.
Figure 6B:
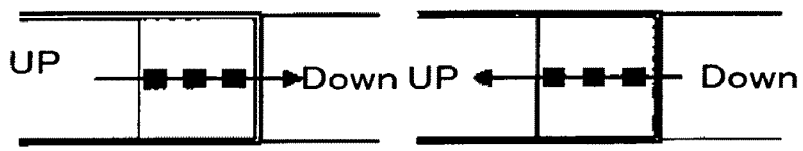

Firstly, a case where two parallel wires on upper and lower layers having the same thickness and width are connected with vias is considered. In the drawings, arrows represent the direction of the electron flow. As shown in FIG. 6A, a via matrix of 2 rows by 5 columns is employed in the related art. On the other hand, in the embodiment, the number of via rows is increased by one and the number of via columns is reduced to one using a ratio of a variation in the number of via columns to a variation in the number of via rows (hereinafter, simply referred to as the ratio) "N", which is determined on the basis of rates of change in a wire life, and the vias are arranged in parallel to a wire located on the electron-flow downstream side viewed from the vias. Vias are arranged in a line to be parallel to a length of parallel wires shown in FIG. 6B if electrons flow in either direction.

Figure 6C:
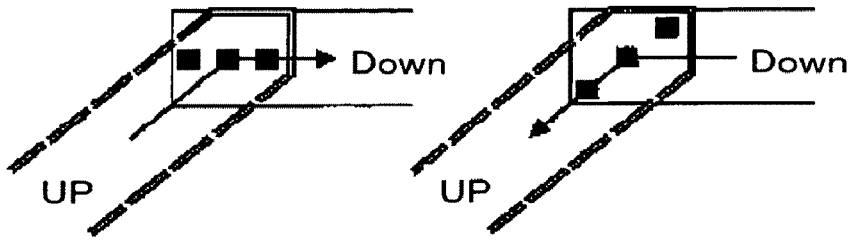

In a case of diagonal wires, arrangement of vias differs depending on the direction of electron flow as shown in FIG. 6C. Since electrons flow from a wire on an upper layer to a wire on a lower layer in a drawing on the left of FIG. 6C, vias are arranged, in a line, along the wire located on the electron-flow downstream side viewed from the vias, i.e., the wire on the lower layer that extends in the horizontal direction. On the other hand, since electrons flow from a wire on a lower layer to a wire on an upper layer in a drawing on the right of FIG. 6C, vias are arranged, in a line, in parallel to the diagonal wire on the upper layer located on the electron-flow downstream side viewed from the vias.

Figure 6D:
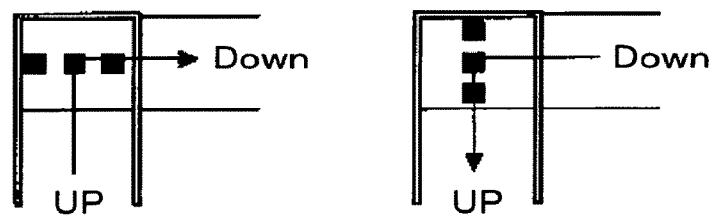

In a case of orthogonal wires, vias are arranged in parallel to a wire located on the electron-flow downstream side viewed from the vias as shown in FIG. 6D. Since electrons flow from a wire on an upper layer to a wire on a lower layer in a drawing on the left of FIG. 6D, vias are arranged, in a line, along the wire on the lower layer that extends in the horizontal direction. On the other hand, since electrons flow from a wire on a lower layer to a wire on an upper layer in a drawing on the right, vias are arranged, in a line, along the wire on the upper layer that extends in the vertical direction.

Figure 6E:
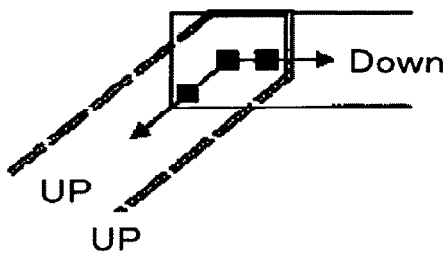
Figure 6F:
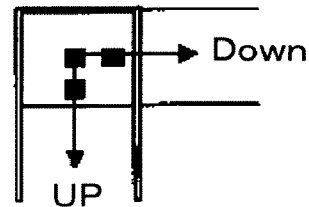

In cases of wires located at parts where electrons flow both directions depending on operations, vias are arranged in a line to be parallel to both wires on upper and lower layers as shown by diagonal wires in FIG. 6E and orthogonal wires in FIG. 6F. Such configurations allow EM resistance to be maintained at a preferable level while reducing the number of vias.

Figure 7A:
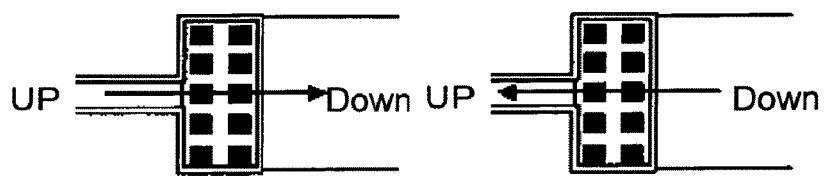
FIGS. 7A to 7F are diagrams for showing via matrices according to a third embodiment of the present invention in which wires of different widths and different thickness located on upper and lower layers are connected.

FIGS. 7A to 7F show via arrangements employed when wires having different width and/or thickness located on upper and lower layers are connected. A configuration of arranging vias in a line so as to be parallel to a wire located on a electron-flow downstream side viewed from the vias is advantageous particularly when the upper-and-lower-layer wires having different widths (or thickness) are connected. In a known designing method, an end part of narrow wire is widened and is connected to an end part of wider wire, so that the entire end parts are used as a via matrix as shown in FIG. 7A.

On the contrary, since the number of via columns significantly reduces every time the number of via rows is increased by one in the first and second embodiments, shapes of via connection areas of each wire can be simplified.

Figure 7B:
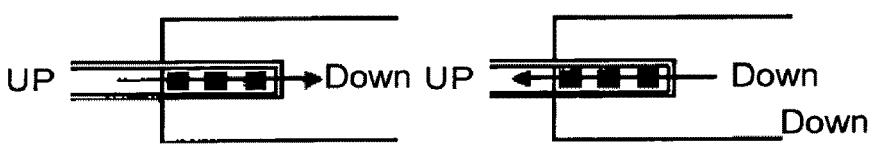

In the case of parallel wires shown in FIG. 7B, since vias are arranged, in a line, along the wire-length direction regardless of a direction of electron flow, a via connection end of a narrower wire does not have to be widened in accordance with a wider wire.

Figure 7C:
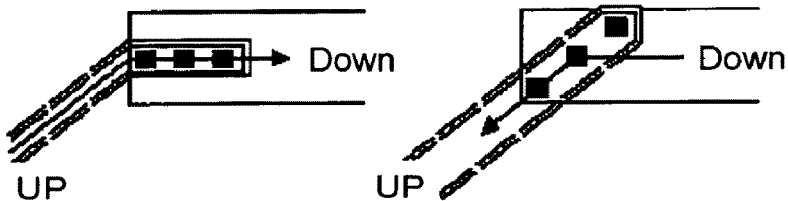

In a case where a narrow diagonal wire is connected to a wide horizontal wire as shown in FIG. 7C, vias are arranged in a line to be parallel to the horizontal wire located on an electron-flow downstream side viewed from the vias when electrons flow from the diagonal wire to the horizontal wire as shown in a drawing on the left. When electrons flow from the horizontal wire to the diagonal wire as shown in a drawing on the right, vias are arranged in a line to be parallel to the diagonal wire located on the electron-flow downstream side viewed from the vias.

Figure 7D:
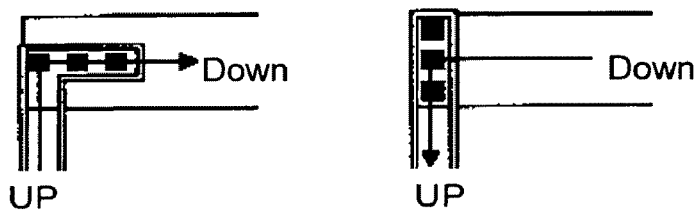

In a case where a narrow orthogonal wire is connected to a wide horizontal wire as shown in FIG. 7D, vias are arranged in a line to be parallel to the horizontal wire located on the electron-flow downstream side viewed from the vias when electrons flow from the orthogonal wire to the horizontal wire as shown in a drawing on the left. When electrons flows from the horizontal wire to the orthogonal wire as shown in a drawing on the right, vias are arranged in a line to be parallel to the orthogonal wire located on the electron-flow downstream side viewed from the via.

Figure 7E:
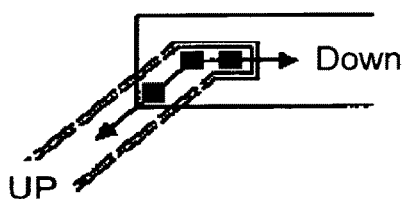
Figure 7F:
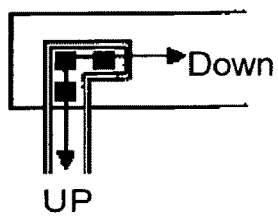

In the case of wires located at parts where electrons flow in both directions depending on operations, vias are arranged so that the via line is parallel to both the wires on the upper and lower layers and so that at least one via column is placed on an extension of a narrow wire as shown by diagonal wires in FIG. 7E and orthogonal wires in FIG. 7F. Such configurations allow EM resistance to be maintained at a preferable level while reducing the number of vias. As described above, in either embodiment, the number of via rows is increased and the number of via columns is decreased on the basis of a rate of change in the wire life in response to a change in the number of via columns, which is the number of vias in the wire-width direction, and of a rate of change in the wire life in response to a change in the number of via rows, which is the number of vias in the wire-length direction, thereby reducing the total number of vias and improving EM resistance.

What is claimed is:

1. A designing method of a semiconductor device including a first wire and a second wire with a plurality of vias, comprising:
    determining a first life time change rate of the first or the second wire in response to a change in a number of via in column direction arranged in a wire-width direction;
    determining a second life time change rate of the first or the second wire in response to a change in a number of via in row direction arranged in a wire-length direction;
    reducing the number of via in column according to a ratio "N" based on the first life time change rate and the second life time change rate, wherein the ratio "N" is represented as the ratio "N"=(the second life time changes rate)/(the first life time changes rate);
    where, ratio "N" is an integer obtained by discarding the fractional part; and increasing the number of via in row at least one.

2. The designing method according to claim 1, wherein, when the first life time change rate of the wire is represented by $S_{column}$ and the second life time change rate of the wire is represented by $S_{line}$, a life time of the semiconductor is represented as the life time $\propto \exp(S_{column} \times$ the number of via in column)
and
the life time $\propto \exp(S_{line} \times$ the number of via in row).

3. The designing method according to claim 1, further comprising:
    increasing the number of via in row or the number of via in column by one as long as the total number of vias does not exceed the total number of vias before the steps of increasing the number of via in row direction and decreasing the number of via in column direction are performed.

4. The designing method according to claim 1, wherein the number of via column is reduced by ratio "N" every time the number of via in row is increased by one.

5. The designing method according to claim 1, wherein the number of via in column is set to one if the original number of via in column is not greater than ratio "N".

6. The designing method according to claim 1, wherein increasing the number of via in row and decreasing the number of via in column are repeatedly performed to reduce the number of via in column ultimately to one.

7. The designing method according to claim 1, wherein greater current allowed for the vias is set as width of the first wire and the second wires becomes wider.

8. The designing method according to claim 2, wherein greater current allowed for the vias is set as width of the first wire and the second wires becomes wider.

9. The designing method according to claim 3, wherein greater current allowed for the vias is set as width of the first wire and the second wires becomes wider.

10. The designing method according to claim 4, wherein greater current allowed for the vias is set as width of the first wire and the second wires becomes wider.

11. The designing method according to claim 5, wherein greater current allowed for the vias is set as width of the first wire and the second wires becomes wider.

12. The designing method according to claim 6, wherein greater current allowed for the vias is set as width of the first wire and the second wires becomes wider.

13. A designing method of a semiconductor device including a first wire and a second wire with a plurality of vias, the second wire being located on a layer different from that of the first wire and extending in a diagonal or orthogonal direction with respect to the first wire, the method comprising:
    arranging the plurality of vias, in a line to be parallel to one of the first wire and the second wire that is located on an electron-flow downstream side with respect to the vias.

14. The designing method according to claim 13, wherein the plurality of vias are arranged, in a line, along both of the first wire and the second wire if electrons flow in both directions through the first wire and the second wire.

* * * * *